US008431942B2

(12) United States Patent
Butterworth

(10) Patent No.: US 8,431,942 B2
(45) Date of Patent: Apr. 30, 2013

(54) LED PACKAGE WITH A ROUNDED SQUARE LENS

(75) Inventor: Mark Butterworth, Santa Clara, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 382 days.

(21) Appl. No.: 12/775,593

(22) Filed: May 7, 2010

(65) Prior Publication Data
US 2011/0272721 A1    Nov. 10, 2011

(51) Int. Cl.
*H01L 33/58*    (2010.01)
(52) U.S. Cl.
USPC ............. 257/98; 257/79; 257/99; 257/103; 257/E33.056; 257/E33.067
(58) Field of Classification Search ............. 257/13, 257/79–103, 918, E51.018–E51.022, E33.001–E33.077, 257/E33.054, E25.028, E25.032
See application file for complete search history.

(56) References Cited

U.S. PATENT DOCUMENTS

| 7,365,371 | B2 | 4/2008 | Andrews |
| 7,452,737 | B2 | 11/2008 | Basin et al. |
| D598,871 | S | 8/2009 | Eberle et al. |
| 2003/0067761 | A1 | 4/2003 | Horiuchi et al. |
| 2008/0157114 | A1* | 7/2008 | Basin et al. ............. 257/98 |
| 2008/0258168 | A1 | 10/2008 | Loh et al. |
| 2009/0045421 | A1 | 2/2009 | Ho et al. |
| 2009/0065792 | A1 | 3/2009 | Thompson et al. |
| 2009/0108281 | A1 | 4/2009 | Keller |
| 2009/0284951 | A1 | 11/2009 | Muschaweck |

FOREIGN PATENT DOCUMENTS

| EP | 2065948 A1 | 6/2009 |
| JP | 2010050236 A | 4/2010 |

* cited by examiner

*Primary Examiner* — Mamadou Diallo

(57) ABSTRACT

A rounded square lens is used instead of a hemispherical lens in an LED package to produce a substantially Lambertian light emission pattern. A cross-sectional view of the rounded square lens cut along its diagonal forms a semicircular surface so as to emulate a hemispherical lens in areas close to the diagonal. A cross-sectional view of the lens cut along its width bisecting the lens forms a bullet shaped surface narrower than the semicircular surface but having the same height as the semicircular surface. The four corners of the lens are rounded. The surface of the lens smoothly transitions between the two surface shapes. Since the rounded square lens has a diagonal dimension larger than a maximum allowable diameter of a hemispherical lens in the same package body, a larger LED die may be used with the rounded square lens to output more light without increasing the size of the package while maintaining a Lambertian emission.

11 Claims, 2 Drawing Sheets

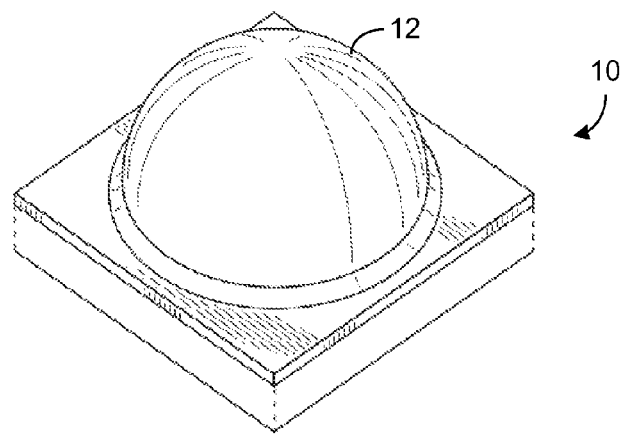
Fig. 1 (prior art)
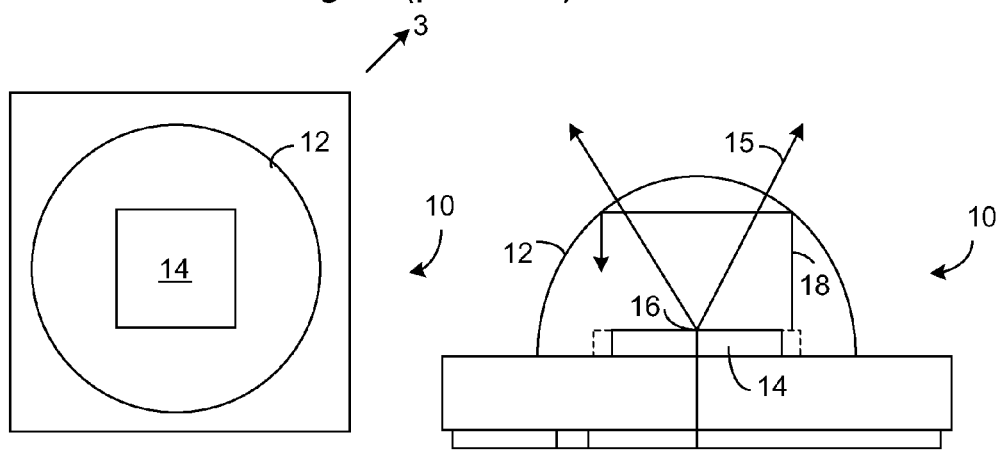
Fig. 2 (prior art)
Fig. 3 (prior art)
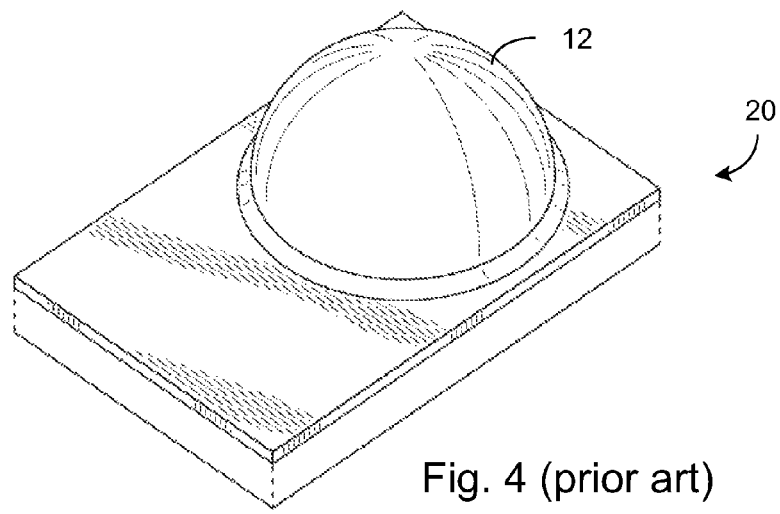
Fig. 4 (prior art)

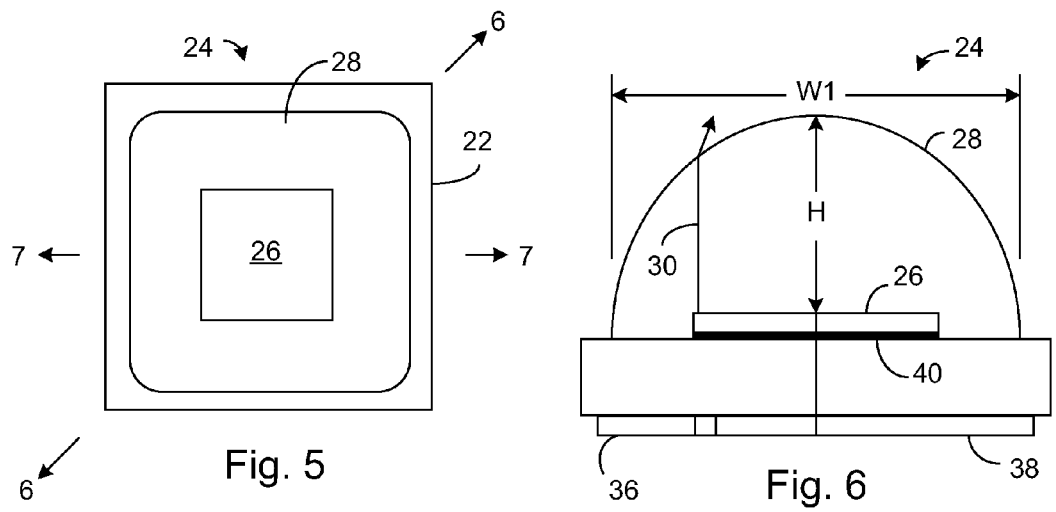
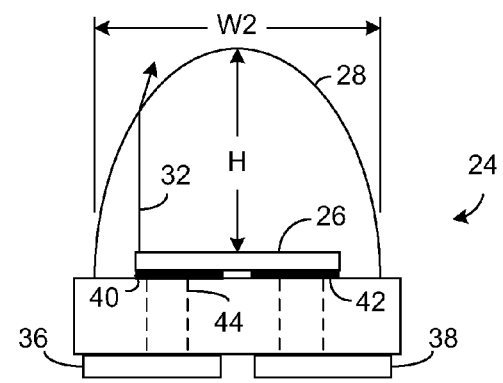
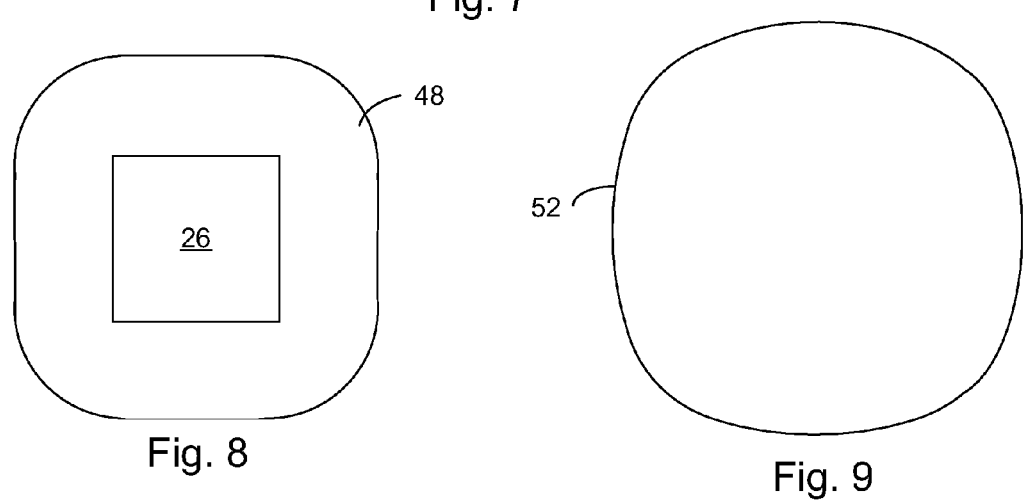

LED PACKAGE WITH A ROUNDED SQUARE LENS

FIELD OF THE INVENTION

This invention relates to light emitting diode (LED) packages and, in particular, to an LED package having a rounded square lens that emits a substantially Lambertian emission pattern.

BACKGROUND

Prior art FIG. 1 is a top perspective view an LED package 10 copied from the present assignee's U.S. Pat. No. D598,871, incorporated herein by reference. The commercial name for the package is the Rebel™. The package 10 is about 3 mm per side. The package 10 contains a square LED die whose sides are aligned with the sides of the package 10. The center axis of the LED die is along the center axis of the hemispherical lens 12. Anode and cathode electrodes are on the bottom surface of the package 10 for soldering to metal pads on a printed circuit board. Anode and cathode electrodes formed on the LED semiconductor layers are electrically connected to the anode and cathode electrodes on the bottom of the package. Typically, the LED layers are mounted on a submount, and the submount electrodes are, in turn, connected to the package electrodes. LEDs and submounts are described in detail in U.S. Pat. No. 7,452,737, assigned to the present assignee and incorporated herein by reference. The emitted light pattern is substantially Lambertian, which forms a circle on a flat surface directly above the package 10.

FIG. 2 is a top down view of the package 10 showing the alignment of the LED die 14 with the lens 12 and package 10.

FIG. 3 is a side view of the package 10 along the diagonal line 3-3 in FIG. 2. In the example of the assignee's actual package 10, the hemispherical lens 12 has a diameter about 2.55 mm, and the LED die 14 is about 1 mm per side. The diagonal length of the LED die is about 1.4 mm. In FIG. 3, the edges of the actual LED die 14 are shown by solid lines. Since the lens 12 is a hemisphere referenced to the top surface of the LED die 14, light rays 15 emitted from the center point 16 of the LED die 14 at all angles impinge on the surface of the lens 12 at substantially right angles, so the light rays 15 are emitted from the package 10 with virtually no internal reflection and no refraction. As the source of light along the LED die surface moves away from the center point 16, the maximum refraction increases since all the light rays do not impinge on the lens 12 surface at right angles. The size of the package 10 and lens 12 are designed for an LED die 14 having maximum sides of about 1 mm to substantially prevent any light rays from being internally reflected by the lens 12.

For example, FIG. 3 illustrates an extension of the LED die 14 in dashed outline and a light ray 18 emitted near the corner of the enlarged LED die. The angle of the light ray 18 is less than the critical angle, resulting in total internal reflection (TIR) of the light ray 18. Such light is thus wasted. Accordingly, the width of a square LED die for use with the package 10 is limited to about 1 mm (the solid outline of the die 14) in order to minimize TIR.

FIG. 4 is a top perspective view of another prior art package 20 by the assignee having the same width and lens 12 as the package 10 of FIG. 1 but a longer length. The diameter of the lens 12 is limited by the width of the package 20.

In some applications, there is a need for greater light output using the same package 10, where the electrode footprint and outer dimensions of the "higher output" package need to be the same as those for the existing package 10. The substantially Lambertian emission pattern also needs to be substantially the same. Although a larger width LED die may be used to emit more light, there will be TIR within the hemispherical lens 12 if a larger LED die is used, greatly reducing the efficiency of the package. The diameter of the hemispherical lens 12 cannot be increased without increasing the width of the package 10.

SUMMARY

The present inventor was faced with the problem of generating more light out of an existing package (FIG. 1 or 4). The package size (footprint) could not be changed. The inventor solved the problem with the present invention.

A rounded square lens is used instead of the hemispherical lens 12 in the package of FIG. 1 or 4, where the width of the rounded square lens is the same as the diameter of the hemispherical lens 12 to allow the rounded square lens to fit within the package 10.

A cross-sectional view of the rounded square lens cut along its diagonal forms a semicircular surface so as to emulate a hemispherical lens along the diagonal and areas close to the diagonal. A cross-sectional view of the lens cut along its width bisecting the lens forms a narrower bullet shaped surface having the same height as the semicircular surface. The four corners of the lens are rounded. The surface of the lens smoothly transitions between the two surface shapes.

The resulting light pattern is substantially Lambertian (substantially similar to the light emission of a hemispherical lens used with a square LED die), forming a substantially circular pattern on a flat surface above the package rather than a square pattern.

Since the rounded square lens has a diagonal dimension that is larger than the maximum diameter of a hemispherical lens in the package, a larger LED die may be used with the rounded square lens. Thus, more light is emitted using the larger LED die with little or no TIR, no increase in the package size, and no apparent change in the Lambertian light pattern. In an actual example, an LED die having sides of up to 1.4 mm may be used in the new package, versus a maximum width LED die of about 1.1 mm in the prior art package 10. This doubles the light emitting top surface area of the LED die.

In an example, the new package having the rounded square lens may replace the old package 10 in a camera flash application, doubling the light output with no change in the camera design.

The shape of the lens below the top surface of the LED die is not very significant since little light is emitted below the top surface. Therefore, the shape of the lens below the top surface may have sharper corners, flanges, or other features that better enable the lens to be affixed to the package body.

The LED dies may be flip-chips, or have top and bottom electrodes, or have top electrodes only.

BRIEF DESCRIPTION OF THE DRAWINGS

FIG. 1 is a top perspective view of a prior art LED package with a hemispherical lens.

FIG. 2 is a simplified top down view of the package of FIG. 1.

FIG. 3 is a side view along the diagonal line 3-3 in FIG. 2 showing light rays emitted from different points on an LED die.

FIG. 4 is a top perspective view of another prior art package having the same width and lens as the package of FIG. 1 but a longer length.

FIG. 5 is a simplified top down view of the package of FIG. 1 but incorporating a rounded square lens whose width is the same as the diameter of the hemispherical lens of FIG. 1, and incorporating a larger LED die, in accordance with one embodiment of the invention.

FIG. 6 is a side view looking into the diagonal line 6-6 in FIG. 5, showing a worst case light ray from a corner of the LED die that does not exhibit TIR.

FIG. 7 is a side view looking into the line 7-7 in FIG. 5, showing a worst case light ray near an edge of the LED die that does not exhibit TIR.

FIG. 8 is a top down view of a rounded square shaped lens with more rounded corners.

FIG. 9 is an example of a substantially circular light pattern, having an equi-brightness boundary, on a flat sheet above the package that is created by the substantially Lambertian light emission of the LED die and lens of FIG. 8.

Elements that are the same or equivalent are labeled with the same numeral.

DETAILED DESCRIPTION

FIGS. 5-8 illustrate the invention.

In FIGS. 5-7, the body 22 of the package 24 may be ceramic, plastic, silicone, or other material. The outer dimensions of the body 22 may be exactly the same as the outer dimensions of the prior art package 10 or 20 bodies, and the electrode structure may be exactly the same, so the package 24 may be substituted for the package 10 or 20 in any application. The only difference is the size of the LED die 26 and the lens 28. The LED die 26, in one example, includes LED semiconductor layers mounted on a ceramic submount having a metal pattern, and electrodes on the submount are connected to the package electrodes, as discussed with respect to FIG. 1. In another embodiment, the LED die 26 does not include a submount.

In an actual example, the diameter of the prior art hemispherical lens 12 in FIGS. 1 and 4 is about 2.55 mm, and the width of the rounded square lens 28 in FIG. 5 is the same size so as to be usable in a package that is the same size as the prior art packages 10 and 20. The width of the square package 24 is about 3 mm. The outer dimensions of the package 24 can also be identical to those of the package 20 in FIG. 4.

FIG. 6 is a side view showing the widest outer dimensions of the lens 28 as viewed looking into the diagonal line 6-6 in FIG. 5 (facing the corners of the LED die 26 and package). When viewed looking into line 6-6, the lens 28 forms a semicircle relative to the top surface of the LED die 26 so that all points along the surface of the lens 28 are equidistant from the center-point of the LED die 26. Accordingly, all light rays from the center-point in the plane of line 6-6 will intersect the lens 28 surface perpendicular to the surface. Since the lens 28 is viewed along its diagonal dimension, it is wider than the lens 28 when viewed looking into the line 7-7 in FIG. 7.

The width of a semicircle (i.e., double the radius) defines its height (the radius). Along the diagonal direction (FIG. 6), the width (W1) of the lens 28 is substantially double the height (H) of the lens 28 above the top surface of the LED die 26, to maintain a hemispherical shape of the lens near the diagonal dimension of the lens.

In FIG. 7, viewed looking at the flat side of the package 24, the height (H) of the lens 28 is the same as in FIG. 6, but the width (W2) is substantially smaller. Therefore, the shape of the lens 28 when viewed looking into line 7-7 is more bullet shaped. The surface of the lens 28 smoothly transitions between the two shapes.

The corners of the lens 28 are rounded (quarter circles) to prevent multiple internal reflections from the corners and to help create the substantially Lambertian light emission. The rounding of the corners reduces the width (W1) along the diagonal.

The overall light emission from the lens 28 is perceived by a human observer as Lambertian due to a substantial portion of the lens being close to hemispherical and due to the rounded corners.

FIG. 6 shows a worst case light ray 30 emitted from the corner of the LED die 26. The light ray 30 angle is greater than the critical angle so there is no TIR. Similarly, FIG. 7 shows a worst case light ray 32 emitted near a side of the LED die 26. The light ray 32 angle is greater than the critical angle so there is no TIR. Since the square LED die 26 can now have sides up to about 1.4 mm (approximately equal to the diagonal length of the maximum allowable size LED die 14 in FIG. 3) without TIR, the light output of the package 24 is about double that of the prior art package 10 or 20 due to the top surface area of the LED die 26 being approximately doubled.

FIGS. 6 and 7 also show the bottom electrodes 36 and 38 of the package 24. Electrodes 40 and 42 are shown in FIGS. 6 and 7 on the bottom of the LED die 26 contacting top metal pads in the package 24, which are connected to the bottom package electrodes 36 and 38 by metal vias 44 or other metal paths. The LED die 26 may have any metal pattern, including interdigitated fingers, dots, bars, etc.

The same lens 28 and LED die 26 may also be used in the package 20 shown in FIG. 4. In one embodiment, the lens 28 is formed of molded silicone, but other transparent or semi-transparent materials may be used.

In one embodiment, the lens 28 has a cavity in its bottom surface. The LED die 26 may be first encapsulated by silicone, then the lens 28 is placed over the LED die 26 and affixed to the package body, with the LED die 26 within the lens cavity so as to be optically coupled to the lens 28.

FIG. 8 illustrates another embodiment of a suitable rounded square lens 48, similar to lens 28 but having more rounded corners (having a larger radius of curvature). Such rounding causes the light emission to be more Lambertian, but slightly reduces the maximum size of the LED die 26 that can be used without TIR. The radius of curvature of the corners may be, for example, one-fourth to one-sixth the width of the lens. The sides may be slightly bowed if the radius of curvature of the corners is large enough.

In one embodiment, the rounding of the corners of the square lens results in the diagonal length of the lens (in the plane of the LED die top surface) being about 1.1-1.3 times the width of the lens, while a square lens with sharp corners would have a diagonal length of about 1.414 times the width of the lens. The height of the lens above the top surface of the LED die is about one-half the diagonal length to create a semicircle above the top surface of the die in the plane of the diagonal. Therefore, for a lens with a width of about 2.55 mm, the diagonal length in one embodiment is between about 2.8-3.3 mm, and the maximum height is about 1.4-1.65 mm.

A preferred ratio of the rounded square lens width to the diagonal length is about 1.2. For such a lens with a width about 2.55 mm, the diagonal length of the lens is about 3 mm, the maximum height of the lens is about 1.5 mm, the package body width is 3 mm, and a maximum LED die size is 1.41 mm per side, arranged as in FIG. 8. The preferred embodiment lens has slightly bowed sides.

FIG. 9 is an example of a substantially circular light pattern 52, having an equi-brightness boundary, on a flat sheet above the package that is created by the substantially Lambertian light emission of the LED die and lens of FIG. 8. Any deviation from a circular pattern 52 would not be perceived by a human observer due to the light smoothly becoming less bright outside the equi-brightness boundary in FIG. 8.

The size of the rounded square shaped lens can be varied for use in any size package and with any size LED die, while retaining the basic relative dimensions of the lens, to minimize the outer dimensions of the package while still achieving a substantially Lambertian light emission pattern and maximizing the size of the LED die for maximum brightness.

The lens need not be a rounded square, but may have two sides slightly longer than the other two sides while still providing a substantially Lambertian emission. The LED die may also have two sides slightly longer than the other two sides. The term "rectangular" as used herein includes square shapes.

Although the diagonal dimension of the lens has been described as forming a semicircle or hemisphere, such a shape is ideal, and process tolerances will result in the shape actually being substantially semicircular. Such a lens shape dimension containing real world variations is considered to be a semicircle for purposes of this disclosure.

The relevant dimensions of the lens described and claimed herein apply only to areas of the lens above the top surface plane of the LED die, since there is little light emission below the top surface plane.

The LED die may be any type of die with or without a phosphor coating or submount. The LED dies may be flip-chips, or have top and bottom electrodes, or have top electrodes only.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting diode (LED) device comprising:
   an LED die having a light emitting top surface;
   a package containing the LED die, the package comprising a body and electrodes connected to the LED die; and
   a rounded rectangular lens mounted on the body,
   the lens having rounded corners in a plane that is parallel to the top surface,
   the lens having a substantially semicircular surface along a diagonal cross-section of the lens that is orthogonal to the top surface, the diagonal cross-section of the lens having a first total width that is less than a total diagonal cross-section width of the body, the substantially semicircular surface having a maximum height H substantially above a centerpoint of the top surface of the LED die,
   the lens having a non-semicircular bullet shaped surface along a width cross-section of the lens that is orthogonal to the top surface, bisecting the lens, the bullet shaped surface having a second total width smaller than the first total width, the bullet shaped surface having a maximum height H above the top surface of the LED die coinciding with the maximum height H of the substantially semicircular surface,
   a surface of the lens smoothly transitioning between the substantially semicircular surface and the non-semicircular bullet shaped surface with no sharp corners above the top surface of the LED die,
   wherein the lens produces a substantially Lambertian light emission pattern when the LED die is energized.

2. The LED device of claim 1 wherein the rounded rectangular lens is a rounded square lens.

3. The LED device of claim 2 wherein the LED die is substantially square, wherein corners of the LED die are sufficiently spaced from rounded corners of the lens so that there is substantially no total internal reflection (TIR) from the lens.

4. The LED device of claim 2 wherein the lens has a side-to-side width of about 2.5 mm, and the LED die has sides greater than 1 mm.

5. The LED device of claim 2 wherein a diagonal width of the lens is about 1.1-1.3 times a side-to-side width of the lens.

6. The LED device of claim 2 wherein the package body has a width of about 3 mm, and the LED die has sides greater than 1 mm.

7. The LED device of claim 2 wherein sides of the lens are straight.

8. The LED device of claim 2 wherein sides of the lens are bowed.

9. The LED device of claim 2 wherein the package body has a width of approximately 3mm, a side-to-side width of the lens is approximately 2.5 mm, a diagonal width of the lens is approximately 3 mm, and a height of the lens above the LED die is approximately 1.5 mm.

10. The LED device of claim 9 wherein the LED die has sides of greater than 1.3 mm.

11. The LED device of claim 10 wherein the LED die has sides of approximately 1.4 mm.

* * * * *